United States Patent
Wang et al.

(10) Patent No.: US 9,309,598 B2
(45) Date of Patent: Apr. 12, 2016

(54) OXIDE AND METAL REMOVAL

(71) Applicant: Applied Materials, Inc., Santa Clara, CA (US)

(72) Inventors: Xikun Wang, Sunnyvale, CA (US); Jie Liu, Sunnyvale, CA (US); Anchuan Wang, San Jose, CA (US); Nitin K. Ingle, San Jose, CA (US); Jeffrey W. Anthis, San Jose, CA (US); Benjamin Schmiege, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/288,696

(22) Filed: May 28, 2014

(65) Prior Publication Data
US 2015/0345028 A1   Dec. 3, 2015

(51) Int. Cl.
| | |
|---|---|
| *C03C 15/00* | (2006.01) |
| *C23F 1/12* | (2006.01) |
| *H01J 37/32* | (2006.01) |
| *H01L 21/3213* | (2006.01) |

(52) U.S. Cl.
CPC .............. *C23F 1/12* (2013.01); *H01J 37/32091* (2013.01); *H01L 21/32138* (2013.01); *H01J 2237/327* (2013.01); *H01J 2237/3341* (2013.01)

(58) Field of Classification Search
CPC .................. H01L 21/32136; H01L 21/02068; H01L 21/32138; C23F 1/12; H01J 37/32091; H01J 2237/327; H01J 2237/3341
USPC ................... 438/692, 720; 216/37, 67
See application file for complete search history.

(56) References Cited

U.S. PATENT DOCUMENTS

| | | | |
|---|---|---|---|
| 2,369,620 A | 2/1945 | Sullivan et al. | |
| 3,451,840 A | 6/1969 | Hough | |

(Continued)

FOREIGN PATENT DOCUMENTS

| | | |
|---|---|---|
| CN | 1375575 | 10/2002 |
| CN | 1412861 A | 4/2003 |

(Continued)

OTHER PUBLICATIONS

Abe et al., "Developments of plasma etching technology for fabricating semiconductor devices," Jpn. J. Appl. Phys., vol. 47, No. 3R, Mar. 2008, 21 pgs.

(Continued)

*Primary Examiner* — Binh X Tran
*Assistant Examiner* — Maki Angadi
(74) *Attorney, Agent, or Firm* — Kilpatrick Townsend & Stockton LLP

(57) ABSTRACT

Methods are described herein for etching metal films which are difficult to volatize. The methods include exposing a metal film to a chlorine-containing precursor (e.g. $Cl_2$). Chlorine is then removed from the substrate processing region. A carbon-and-nitrogen-containing precursor (e.g. TMEDA) is delivered to the substrate processing region to form volatile metal complexes which desorb from the surface of the metal film. The methods presented remove metal while very slowly removing the other exposed materials. A thin metal oxide layer may be present on the surface of the metal layer, in which case a local plasma from hydrogen may be used to remove the oxygen or amorphize the near surface region, which has been found to increase the overall etch rate.

18 Claims, 6 Drawing Sheets

(56) References Cited

U.S. PATENT DOCUMENTS

| | | |
|---|---|---|
| 3,937,857 A | 2/1976 | Brummett et al. |
| 3,969,077 A | 7/1976 | Hill |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,381,441 A | 4/1983 | Tylko |
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,625,678 A | 12/1986 | Shioya et al. |
| 4,632,857 A | 12/1986 | Mallory, Jr. |
| 4,656,052 A | 4/1987 | Satou et al. |
| 4,690,746 A | 9/1987 | McInerney et al. |
| 4,714,520 A | 12/1987 | Gwozdz |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,851,370 A | 7/1989 | Doklan et al. |
| 4,857,140 A | 8/1989 | Loewenstein |
| 4,865,685 A | 9/1989 | Palmour |
| 4,868,071 A | 9/1989 | Walsh et al. |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Loewenstein et al. |
| 4,913,929 A | 4/1990 | Moslehi et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,994,404 A | 2/1991 | Sheng et al. |
| 5,000,113 A | 3/1991 | Wang et al. |
| 5,013,691 A | 5/1991 | Lory et al. |
| 5,028,565 A | 7/1991 | Chang |
| 5,030,319 A | 7/1991 | Nishino et al. |
| 5,061,838 A | 10/1991 | Lane et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,203,911 A | 4/1993 | Sricharoenchaikit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,527 A | 9/1993 | Uchida et al. |
| 5,252,178 A | 10/1993 | Moslehi |
| 5,266,157 A | 11/1993 | Kadomura |
| 5,270,125 A | 12/1993 | America et al. |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,403 A | 12/1995 | Shinagawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,599,740 A | 2/1997 | Jang et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,676,758 A | 10/1997 | Hasegawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |

(56) References Cited

U.S. PATENT DOCUMENTS

| | | |
|---|---|---|
| 5,719,085 A | 2/1998 | Moon et al. |
| 5,733,816 A | 3/1998 | Iyer et al. |
| 5,747,373 A | 5/1998 | Yu |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,814,365 A | 9/1998 | Mahawili |
| 5,820,723 A | 10/1998 | Benjamin et al. |
| 5,824,599 A | 10/1998 | Schacham-Diamand et al. |
| 5,830,805 A | 11/1998 | Shacham-Diamand et al. |
| 5,838,055 A | 11/1998 | Kleinhenz et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,915,190 A | 6/1999 | Pirkle |
| 5,918,116 A | 6/1999 | Chittipeddi |
| 5,920,792 A | 7/1999 | Lin |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,951,601 A | 9/1999 | Lesinski et al. |
| 5,951,776 A | 9/1999 | Selyutin et al. |
| 5,951,896 A | 9/1999 | Mahawili |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A | 12/1999 | Abraham |
| 6,007,635 A | 12/1999 | Mahawili |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,147 A | 6/2000 | Koshiishi |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,812 B1 | 1/2001 | Hsiung et al. |
| 6,176,198 B1 | 1/2001 | Kao et al. |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,184,121 B1 | 2/2001 | Buchwalter et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |

(56) References Cited

U.S. PATENT DOCUMENTS

| | | | |
|---|---|---|---|
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,291,282 B1 | 9/2001 | Wilk et al. |
| 6,291,348 B1 | 9/2001 | Lopatin et al. |
| 6,303,044 B1 | 10/2001 | Koemtzopoulos |
| 6,303,418 B1 | 10/2001 | Cha et al. |
| 6,312,554 B1 | 11/2001 | Ye |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,322,716 B1 | 11/2001 | Qiao et al. |
| 6,323,128 B1 | 11/2001 | Sambucetti et al. |
| 6,335,261 B1 | 1/2002 | Natzle et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,416,874 B1 | 7/2002 | Cox et al. |
| 6,423,284 B1 | 7/2002 | Arno |
| 6,427,623 B2 | 8/2002 | Ko |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,531,377 B2 | 3/2003 | Knorr et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,586,163 B1 | 7/2003 | Okabe et al. |
| 6,596,599 B1 | 7/2003 | Guo |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,663,715 B1 | 12/2003 | Yuda et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,852,550 B2 | 2/2005 | Tuttle et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,867,141 B2 | 3/2005 | Jung et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,942,753 B2 | 9/2005 | Choi et al. |
| 6,946,033 B2 | 9/2005 | Tsuei et al. |
| 6,951,821 B2 | 10/2005 | Hamelin et al. |

(56) References Cited

U.S. PATENT DOCUMENTS

| | | |
|---|---|---|
| 6,958,175 B2 | 10/2005 | Sakamoto et al. |
| 6,958,286 B2 | 10/2005 | Chen et al. |
| 6,974,780 B2 | 12/2005 | Schuegraf |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,071,532 B2 | 7/2006 | Geffken et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,145,725 B2 | 12/2006 | Hasei et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,235,137 B2 | 6/2007 | Kitayama et al. |
| 7,252,716 B2 | 8/2007 | Kim et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,358,192 B2 | 4/2008 | Merry et al. |
| 7,365,016 B2 | 4/2008 | Ouellet et al. |
| 7,390,710 B2 | 6/2008 | Derderian et al. |
| 7,396,480 B2 | 7/2008 | Kao et al. |
| 7,416,989 B1 | 8/2008 | Liu et al. |
| 7,465,358 B2 | 12/2008 | Weidman et al. |
| 7,468,319 B2 * | 12/2008 | Lee .................. 438/652 |
| 7,484,473 B2 | 2/2009 | Keller et al. |
| 7,488,688 B2 | 2/2009 | Chung et al. |
| 7,494,545 B2 | 2/2009 | Lam et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,628,897 B2 | 12/2009 | Mungekar et al. |
| 7,682,518 B2 * | 3/2010 | Chandrachood et al. ....... 216/67 |
| 7,708,859 B2 | 5/2010 | Huang et al. |
| 7,709,396 B2 | 5/2010 | Bencher et al. |
| 7,722,925 B2 | 5/2010 | White et al. |
| 7,723,221 B2 | 5/2010 | Hayashi |
| 7,749,326 B2 | 7/2010 | Kim et al. |
| 7,785,672 B2 | 8/2010 | Choi et al. |
| 7,790,634 B2 | 9/2010 | Munro et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,981,806 B2 | 7/2011 | Jung |
| 7,989,365 B2 | 8/2011 | Park et al. |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,119,530 B2 | 2/2012 | Hori et al. |
| 8,133,349 B1 | 3/2012 | Panagopoulos |
| 8,183,134 B2 | 5/2012 | Wu |
| 8,187,486 B1 | 5/2012 | Liu et al. |
| 8,211,808 B2 | 7/2012 | Sapre et al. |
| 8,298,627 B2 | 10/2012 | Minami et al. |
| 8,309,440 B2 | 11/2012 | Sanchez et al. |
| 8,313,610 B2 | 11/2012 | Dhindsa |
| 8,328,939 B2 | 12/2012 | Choi et al. |
| 8,368,308 B2 | 2/2013 | Banna et al. |
| 8,435,902 B2 | 5/2013 | Tang et al. |
| 8,475,674 B2 | 7/2013 | Thadani et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,623,148 B2 | 1/2014 | Mitchell et al. |
| 8,623,471 B2 | 1/2014 | Tyler et al. |
| 8,642,481 B2 | 2/2014 | Wang et al. |
| 8,679,982 B2 | 3/2014 | Wang et al. |
| 8,679,983 B2 | 3/2014 | Wang et al. |
| 8,741,778 B2 | 6/2014 | Yang et al. |
| 8,747,680 B1 | 6/2014 | Deshpande |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,808,563 B2 | 8/2014 | Wang et al. |
| 8,846,163 B2 | 9/2014 | Kao et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,733 B2 | 3/2015 | Uehara et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 | 6/2015 | Ikeda et al. |
| 9,093,371 B2 | 7/2015 | Wang et al. |
| 9,093,390 B2 | 7/2015 | Wang et al. |
| 9,111,877 B2 | 8/2015 | Chen et al. |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,786 B1 | 10/2015 | Purayath et al. |
| 9,184,055 B2 | 11/2015 | Wang et al. |
| 2001/0008803 A1 | 7/2001 | Takamatsu et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0030366 A1 | 10/2001 | Nakano et al. |
| 2001/0034121 A1 | 10/2001 | Fu et al. |
| 2001/0036706 A1 | 11/2001 | Kitamura |
| 2001/0037856 A1 | 11/2001 | Park |
| 2001/0041444 A1 | 11/2001 | Shields et al. |
| 2001/0047760 A1 | 12/2001 | Mosiehl |
| 2001/0053585 A1 | 12/2001 | Kikuchi et al. |
| 2001/0054381 A1 | 12/2001 | Umotoy et al. |
| 2001/0055842 A1 | 12/2001 | Uh et al. |
| 2002/0000202 A1 | 1/2002 | Yuda et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028582 A1 | 3/2002 | Nallan et al. |
| 2002/0028585 A1 | 3/2002 | Chung et al. |

(56) References Cited

U.S. PATENT DOCUMENTS

| | | |
|---|---|---|
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0045966 A1 | 4/2002 | Lee et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0090781 A1 | 7/2002 | Skotnicki et al. |
| 2002/0098681 A1 | 7/2002 | Hu et al. |
| 2002/0124867 A1 | 9/2002 | Kim et al. |
| 2002/0129769 A1 | 9/2002 | Kim et al. |
| 2002/0153808 A1 | 10/2002 | Skotnicki et al. |
| 2002/0164885 A1 | 11/2002 | Lill et al. |
| 2002/0177322 A1 | 11/2002 | Li et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0003757 A1 | 1/2003 | Naltan et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0140844 A1 | 7/2003 | Maa et al. |
| 2003/0148035 A1 | 8/2003 | Lingampalli |
| 2003/0159307 A1 | 8/2003 | Sago et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0205329 A1 | 11/2003 | Gujer et al. |
| 2003/0215963 A1 | 11/2003 | AmRhein et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0020801 A1 | 2/2004 | Zhao et al. |
| 2004/0026371 A1 | 2/2004 | Nguyen et al. |
| 2004/0033678 A1 | 2/2004 | Arghavani et al. |
| 2004/0050328 A1 | 3/2004 | Kumagai et al. |
| 2004/0058293 A1 | 3/2004 | Nguyen et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0092063 A1 | 5/2004 | Okumura et al. |
| 2004/0099378 A1 | 5/2004 | Kim et al. |
| 2004/0101667 A1 | 5/2004 | O'Loughlin et al. |
| 2004/0110354 A1 | 6/2004 | Natzle et al. |
| 2004/0115876 A1 | 6/2004 | Goundar et al. |
| 2004/0129224 A1 | 7/2004 | Yamazaki |
| 2004/0137161 A1 | 7/2004 | Segawa et al. |
| 2004/0144490 A1 | 7/2004 | Zhao et al. |
| 2004/0147126 A1 | 7/2004 | Yamashita et al. |
| 2004/0152342 A1 | 8/2004 | Li |
| 2004/0154535 A1 | 8/2004 | Chen et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219789 A1 | 11/2004 | Wood et al. |
| 2004/0245091 A1 | 12/2004 | Karim et al. |
| 2004/0263827 A1 | 12/2004 | Xu |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0073051 A1 | 4/2005 | Yamamoto et al. |
| 2005/0090120 A1 | 4/2005 | Hasegawa et al. |
| 2005/0098111 A1 | 5/2005 | Shimizu et al. |
| 2005/0105991 A1 | 5/2005 | Hofmeister et al. |
| 2005/0112876 A1 | 5/2005 | Wu |
| 2005/0112901 A1 | 5/2005 | Ji et al. |
| 2005/0121750 A1 | 6/2005 | Chan et al. |
| 2005/0164479 A1 | 7/2005 | Perng et al. |
| 2005/0181588 A1 | 8/2005 | Kim |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1 | 9/2005 | Hanawa et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0251990 A1 | 11/2005 | Choi et al. |
| 2005/0266622 A1 | 12/2005 | Arghavani et al. |
| 2005/0266691 A1 | 12/2005 | Gu et al. |
| 2005/0269030 A1 | 12/2005 | Kent et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0006057 A1 | 1/2006 | Laermer |
| 2006/0011298 A1 | 1/2006 | Lim et al. |
| 2006/0016783 A1 | 1/2006 | Wu et al. |
| 2006/0019456 A1 | 1/2006 | Bu et al. |
| 2006/0019486 A1 | 1/2006 | Yu et al. |
| 2006/0021574 A1 | 2/2006 | Armour et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0060942 A1 | 3/2006 | Minixhofer et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0121724 A1 | 6/2006 | Yue et al. |
| 2006/0124242 A1 | 6/2006 | Kanarik et al. |
| 2006/0130971 A1 | 6/2006 | Chang et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0178008 A1 | 8/2006 | Yeh et al. |

(56) References Cited

U.S. PATENT DOCUMENTS

| | | |
|---|---|---|
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0210723 A1 | 9/2006 | Ishizaka |
| 2006/0211260 A1 | 9/2006 | Tran et al. |
| 2006/0216878 A1 | 9/2006 | Lee |
| 2006/0216923 A1 | 9/2006 | Tran et al. |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0260750 A1 | 11/2006 | Rueger |
| 2006/0261490 A1 | 11/2006 | Su et al. |
| 2006/0264003 A1 | 11/2006 | Eun |
| 2006/0264043 A1 | 11/2006 | Stewart et al. |
| 2006/0266288 A1 | 11/2006 | Choi |
| 2007/0048977 A1 | 3/2007 | Lee et al. |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0131274 A1 | 6/2007 | Stollwerck et al. |
| 2007/0163440 A1 | 7/2007 | Kim et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0212288 A1 | 9/2007 | Holst |
| 2007/0231109 A1 | 10/2007 | Pak et al. |
| 2007/0232071 A1 | 10/2007 | Balseanu et al. |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0264820 A1 | 11/2007 | Liu |
| 2007/0266946 A1 | 11/2007 | Choi |
| 2007/0269976 A1 | 11/2007 | Futase et al. |
| 2007/0277734 A1 | 12/2007 | Lubomirsky et al. |
| 2007/0281106 A1 | 12/2007 | Lubomirsky et al. |
| 2008/0044990 A1 | 2/2008 | Lee |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0115726 A1 | 5/2008 | Ingle et al. |
| 2008/0121970 A1 | 5/2008 | Aritome |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0153306 A1 | 6/2008 | Cho et al. |
| 2008/0156771 A1 | 7/2008 | Jeon et al. |
| 2008/0160210 A1 | 7/2008 | Yang et al. |
| 2008/0162781 A1 | 7/2008 | Haller et al. |
| 2008/0171407 A1 | 7/2008 | Nakabayashi et al. |
| 2008/0173906 A1 | 7/2008 | Zhu |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0202892 A1 | 8/2008 | Smith et al. |
| 2008/0230519 A1 | 9/2008 | Takahashi |
| 2008/0233709 A1 | 9/2008 | Conti et al. |
| 2008/0254635 A1 | 10/2008 | Benzel et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0001480 A1 | 1/2009 | Cheng |
| 2009/0004849 A1 | 1/2009 | Eun |
| 2009/0017227 A1 | 1/2009 | Fu et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087979 A1 | 4/2009 | Raghuram |
| 2009/0095621 A1 | 4/2009 | Kao et al. |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0111280 A1 | 4/2009 | Kao et al. |
| 2009/0120464 A1 | 5/2009 | Rasheed et al. |
| 2009/0170221 A1 | 7/2009 | Jacques et al. |
| 2009/0179300 A1 | 7/2009 | Arai |
| 2009/0189246 A1 | 7/2009 | Wu et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0294898 A1 | 12/2009 | Feustel et al. |
| 2010/0003824 A1 | 1/2010 | Kadkhodayan et al. |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher |
| 2010/0093151 A1 | 4/2010 | Arghavani et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0130001 A1 | 5/2010 | Noguchi |
| 2010/0144140 A1 | 6/2010 | Chandrashekar et al. |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207205 A1 | 8/2010 | Grebs et al. |
| 2010/0240205 A1 | 9/2010 | Son |
| 2010/0294199 A1 | 11/2010 | Tran et al. |
| 2010/0330814 A1 | 12/2010 | Yokota et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0045676 A1 | 2/2011 | Park |
| 2011/0053380 A1 | 3/2011 | Sapre et al. |
| 2011/0061810 A1 | 3/2011 | Ganguly et al. |
| 2011/0081782 A1 | 4/2011 | Liang et al. |
| 2011/0100489 A1 | 5/2011 | Orito |
| 2011/0111596 A1 | 5/2011 | Kanakasabapathy |
| 2011/0114601 A1 | 5/2011 | Lubomirsky et al. |

(56) References Cited

U.S. PATENT DOCUMENTS

| | | |
|---|---|---|
| 2011/0115378 A1 | 5/2011 | Lubomirsky et al. |
| 2011/0124144 A1 | 5/2011 | Schlemm et al. |
| 2011/0143542 A1 | 6/2011 | Feurprier et al. |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165771 A1 | 7/2011 | Ring et al. |
| 2011/0180847 A1 | 7/2011 | Ikeda et al. |
| 2011/0195575 A1 | 8/2011 | Wang |
| 2011/0217851 A1 | 9/2011 | Liang et al. |
| 2011/0226734 A1 | 9/2011 | Sumiya et al. |
| 2011/0230052 A1 | 9/2011 | Tang et al. |
| 2011/0232737 A1 | 9/2011 | Ruletzki et al. |
| 2011/0266252 A1 | 11/2011 | Thadani et al. |
| 2011/0266682 A1 | 11/2011 | Edelstein et al. |
| 2011/0294300 A1 | 12/2011 | Zhang et al. |
| 2011/0298061 A1 | 12/2011 | Siddiqui et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0068242 A1 | 3/2012 | Shin et al. |
| 2012/0103518 A1 | 5/2012 | Kakimoto |
| 2012/0129354 A1 | 5/2012 | Luong |
| 2012/0135576 A1 | 5/2012 | Lee et al. |
| 2012/0161405 A1 | 6/2012 | Mohn et al. |
| 2012/0164839 A1 | 6/2012 | Nishimura |
| 2012/0180954 A1 | 7/2012 | Yang et al. |
| 2012/0196447 A1 | 8/2012 | Yang et al. |
| 2012/0211462 A1 | 8/2012 | Zhang et al. |
| 2012/0223048 A1 | 9/2012 | Paranjpe et al. |
| 2012/0225557 A1 | 9/2012 | Serry et al. |
| 2012/0228642 A1 | 9/2012 | Aube et al. |
| 2012/0238102 A1 | 9/2012 | Zhang et al. |
| 2012/0238103 A1 | 9/2012 | Zhang et al. |
| 2012/0247671 A1 | 10/2012 | Sugawara |
| 2012/0267346 A1 | 10/2012 | Kao et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0005103 A1 | 1/2013 | Liu et al. |
| 2013/0005140 A1 | 1/2013 | Jeng et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0082197 A1 | 4/2013 | Yang et al. |
| 2013/0089988 A1 | 4/2013 | Wang et al. |
| 2013/0119016 A1 | 5/2013 | Kagoshima et al. |
| 2013/0119483 A1 | 5/2013 | Alptekin et al. |
| 2013/0130507 A1 | 5/2013 | Wang et al. |
| 2013/0187220 A1 | 7/2013 | Surthi |
| 2013/0193108 A1 | 8/2013 | Zheng |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0284369 A1 | 10/2013 | Kobayashi et al. |
| 2013/0284370 A1 | 10/2013 | Kobayashi et al. |
| 2013/0298942 A1 | 11/2013 | Ren et al. |
| 2013/0302980 A1 | 11/2013 | Chandrashekar et al. |
| 2014/0004708 A1 | 1/2014 | Thedjoisworo |
| 2014/0021673 A1 | 1/2014 | Chen et al. |
| 2014/0057447 A1 | 2/2014 | Yang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1* | 3/2014 | Nam et al. ........................ 438/5 |
| 2014/0097270 A1 | 4/2014 | Liang et al. |
| 2014/0099794 A1 | 4/2014 | Ingle et al. |
| 2014/0141621 A1 | 5/2014 | Ren et al. |
| 2014/0166617 A1 | 6/2014 | Chen |
| 2014/0166618 A1 | 6/2014 | Tadigadapa et al. |
| 2014/0190410 A1 | 7/2014 | Kim |
| 2014/0199851 A1 | 7/2014 | Nemani et al. |
| 2014/0227881 A1 | 8/2014 | Lubomirsky et al. |
| 2014/0234466 A1 | 8/2014 | Gao et al. |
| 2014/0248780 A1 | 9/2014 | Ingle et al. |
| 2014/0256131 A1 | 9/2014 | Wang et al. |
| 2014/0262031 A1 | 9/2014 | Belostotskiy et al. |
| 2014/0262038 A1 | 9/2014 | Wang et al. |
| 2014/0263272 A1 | 9/2014 | Duan et al. |
| 2014/0264533 A1 | 9/2014 | Simsek-Ege |
| 2014/0271097 A1 | 9/2014 | Wang et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273489 A1 | 9/2014 | Wang et al. |
| 2014/0273491 A1 | 9/2014 | Zhang et al. |
| 2014/0273492 A1* | 9/2014 | Anthis et al. .................. 438/720 |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0060265 A1 | 3/2015 | Cho et al. |
| 2015/0079797 A1 | 3/2015 | Chen et al. |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132968 A1 | 5/2015 | Ren et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221541 A1 | 8/2015 | Nemani et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0275361 A1 | 10/2015 | Lubomirsky et al. |
| 2015/0275375 A1 | 10/2015 | Kim et al. |

FOREIGN PATENT DOCUMENTS

| | | |
|---|---|---|
| CN | 101465386 A | 6/2009 |
| EP | 0329406 | 8/1989 |
| EP | 0376252 A2 | 7/1990 |
| EP | 0475567 | 3/1992 |
| EP | 0 496 543 A2 | 7/1992 |
| EP | 0 658 928 A1 | 6/1995 |
| EP | 0697467 A1 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| GB | 2285174 | 6/1995 |

(56) References Cited

FOREIGN PATENT DOCUMENTS

| | | |
|---|---|---|
| JP | 61-276977 A | 12/1986 |
| JP | 2058836 A | 2/1990 |
| JP | 02-121330 A | 5/1990 |
| JP | 02256235 | 10/1990 |
| JP | 4-239750 | 7/1992 |
| JP | 4-341568 A | 11/1992 |
| JP | 07-130713 A | 5/1995 |
| JP | 7-161703 A | 6/1995 |
| JP | 7297543 | 11/1995 |
| JP | 08-306671 A | 11/1996 |
| JP | 09153481 A | 6/1997 |
| JP | 09-205140 A | 8/1997 |
| JP | 10-178004 A | 6/1998 |
| JP | 2010-154699 | 6/1998 |
| JP | 11124682 | 5/1999 |
| JP | H11-204442 | 7/1999 |
| JP | 2000-012514 A | 1/2000 |
| JP | 2001-308023 | 11/2001 |
| JP | 2005-033023 A | 11/2001 |
| JP | 2002-100578 | 4/2002 |
| JP | 2002-141349 | 5/2002 |
| JP | 2002-222861 A | 8/2002 |
| JP | 2003-019433 | 1/2003 |
| JP | 2003-059914 | 2/2003 |
| JP | 2003-179038 A | 6/2003 |
| JP | 2003-217898 | 7/2003 |
| JP | 2003-318158 A | 11/2003 |
| JP | 2003-347278 A | 12/2003 |
| JP | 2004-047956 A | 2/2004 |
| JP | 2004-156143 A | 6/2004 |
| JP | 04-239723 A | 8/2004 |
| JP | 2007-173383 A | 7/2007 |
| JP | 08-148470 A | 6/2008 |
| JP | 2009-044129 A | 2/2009 |
| KR | 10-0155601 B1 | 12/1998 |
| KR | 10-0236521 B1 | 12/1999 |
| KR | 1020000008278 A | 2/2000 |
| KR | 2000-0044928 | 7/2000 |
| KR | 2001-0014064 A | 2/2001 |
| KR | 10-2001-0058774 A | 7/2001 |
| KR | 10-2001-0082109 | 8/2001 |
| KR | 10-2003-0054726 A | 7/2003 |
| KR | 1020030096140 | 12/2003 |
| KR | 10-2004-0049739 A | 6/2004 |
| KR | 10-2004-0096365 A | 11/2004 |
| KR | 1020050042701 A | 5/2005 |
| KR | 10-0681390 | 9/2006 |
| KR | 10-2008-0013174 A | 2/2008 |
| KR | 1020080063988 A | 7/2008 |
| KR | 10-2009-0080533 A | 7/2009 |
| KR | 10-2010-0013980 A | 2/2010 |
| KR | 10-2010-0074508 A | 7/2010 |
| KR | 10-2010-0075957 A | 7/2010 |
| KR | 10/2010/0083629 A | 7/2010 |
| KR | 10-2010-0099535 A | 9/2010 |
| KR | 10-2001-0049274 A | 6/2011 |
| KR | 10-2011-0086540 A | 7/2011 |
| KR | 10-1050454 B1 | 7/2011 |
| KR | 1020110126675 A | 11/2011 |
| KR | 1020120082640 A | 7/2012 |
| WO | 92/20833 A1 | 11/1992 |
| WO | 99/26277 A1 | 5/1999 |
| WO | 99/54920 A2 | 10/1999 |
| WO | 99/62108 A2 | 12/1999 |
| WO | 00/13225 A1 | 3/2000 |
| WO | 00/22671 | 4/2000 |
| WO | 01/94719 A1 | 12/2001 |
| WO | 02083981 A2 | 10/2002 |
| WO | 03014416 | 2/2003 |
| WO | 2004/006303 | 1/2004 |
| WO | 2005036615 A2 | 4/2004 |
| WO | 2004/074932 | 9/2004 |
| WO | 2004/114366 A2 | 12/2004 |
| WO | 2006/069085 A2 | 6/2006 |
| WO | 2009/071627 A2 | 6/2009 |
| WO | 2011/087580 A1 | 7/2011 |
| WO | 2011/115761 A2 | 9/2011 |
| WO | 2011/139435 A2 | 11/2011 |
| WO | 2012/018449 A2 | 2/2012 |
| WO | 2012/125654 A2 | 9/2012 |

OTHER PUBLICATIONS

Cho et al., "Dielectric-barrier microdischarge structure for effic ient positive-column plasma using a thick-film ceramic sheet," IEEE Trans. Plasma Sci., vol. 37, No. 8, Aug. 2009, 4 pgs.

Cho, T.S., "Dual Discharge Modes Operation of an Argon Plasma Generated by Commercial Electronic Ballast for Remote Plasma Removal Process," IEEE Transactions on Plasma Science, vol. 42, No. 6, , Jun. 2014, 4 pages.

Cho et al., "Three-dimensional spatiotemporal behaviors of light emission from discharge plasma of alternating current plasma display panels," Appl. Phys. Lett. , vol. 92, No. 22, Jun. 2008, 3pgs.

Cho et al., "Analysis of address discharge modes by using a three-dimensional plasma display panel," IEEE Trans. Plasma Sci. , vol. 36, Oct. 2008, 4 pgs.

C.K. Hu, et al. "Reduced Electromigration of Cu Wires by Surface Coating" Applied Physics Letters, vol. 81, No. 10, Sep. 2, 2002- pp. 1782-1784.

European Search Report dated May 23, 2006 for EP Application No. 05251143.3.

European Examination Report dated Nov. 13, 2007 for EP Application No. 05251143.3.

EP Partial Search Report, Application No. 08150111.601235/ 1944796, dated Aug. 22, 2008.

Eze, F. C., "Electroless deposition of CoO thin films," J. Phys. D: Appl. Phys. 32 (1999), pp. 533-540.

Galiano et al. "Stress-Temperature Behavior of Oxide Films Used for Intermetal Dielectric Applications", VMIC Conference, Jun. 9-10, 1992, pp. 100-106.

Goebels, F.J. et al. "Arbitraty Polarization from Annular Slot Planar Antennas." Ire Transactions on Antennas and Propagation, Jul. 1961, 8 pgs.

Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.

International Search Report of PCT/US2009/059743 mailed on Apr. 26, 2010, 4 pages.

International Search Report of PCT/US2012/061726 mailed on May 16, 2013, 3 pages.

International Search Report of PCT/2013/052039 mailed on Nov. 8, 2013, 9 pages.

International Search Report of PCT/2013/037202 mailed on Aug. 23, 2013, 11 pages.

Kim et al., "Pendulum electrons in micro hollow cathode di scharges," IEEE Trans. Plasma Sci. , vol. 36, No. 4, pp. Aug. 2008, 2 pgs.

Lin, et al., "Manufacturing of Cu Electroless Nickel/Sn-Pb Flip Chip Solder Bumps", IEEE Transactions on Advanced Packaging, vol. 22, No. 4 (Nov. 1999), pp. 575-579.

Lopatin, et al., "Thin Electroless barrier for copper films", Part of the SPIE Conference of Multilevel Interconnect technology II, SPIE vol. 3508 (1998), pp. 65-77.

Musaka, "Single Step Gap Filling Technology fo Subhalf Micron Metal Spacings on Plasma Enhanced $TEOS/O_2$ Chemical Vapor Deposition System," Extended Abstracts of the 1993 International Conference on Solid State Devices and Materials pages, 1993, 510-512.

Pearlstein, Fred. "Electroless Plating," J. Res. Natl. Bur. Stan., Ch. 31 (1974), pp. 710-747.

Redolfi et al., "Bulk FinFET fabrication with new approaches for oxide topography control using dry removal techniques," Solid-State Electron., vol. 71, May 2012, 7 pgs.

Saito, et al., "Electroless deposition of Ni-B, Co-B and Ni-Co-B alloys using dimethylamineborane as a reducing agent," Journal of Applied Electrochemistry 28 (1998), pp. 559-563.

(56) References Cited

OTHER PUBLICATIONS

Schacham-Diamond, et al., "Electrochemically deposited thin film alloys for ULSI and MEMS applications," Microelectronic Engineering 50 (2000), pp. 525-531.
Schacham-Diamond, et al. "Material properties of electroless 100-200 nm thick CoWP films," Electrochemical Society Proceedings, vol. 99-34, pp. 102-110.
Schoenbach et al.,"High-pressure hollow cathode di scharges," Plasma Sources Sci. Te chnol.,vol. 6, No. 4, Nov. 1997, 10 pgs.
Smayling, et al., "APF® Pitch-Halving for 2nm Logic Cells using Gridded Design Rules", proceedings of the SPIE, 2008, 8 pages.
Vassiliev, et al., "Trends in void-free pre-metal CVD dielectrics," Solid State Technology, Mar. 2001, pp. 129-136.
Weston, et al., "Ammonium Compounds," Kirk-Othmer Encyclopedia of Chemical Technology, 2003,30 pages see pp. 717-718, John Wiley & Sons, Inc.
Yasaka, Y. et al. "Planar microwave discharges with active control of plasma uniformity". Physics of Plasmas, vol. 9 No. 3, Mar. 2002, 7 pgs.
Yosi Shacham-Diamond, et al. "High Aspect Ratio Quarter-Micron Electroless Copper Integrated Technology", Microelectronic Engineering 37/38 (1997) pp. 77-88.
Abraham, "Reactive Facet Tapering of Plasma Oxide for Multilevel Interconnect Applications", IEEE, V-MIC Conference, Jun. 15-16, 1987, pp. 115-121.
Applied Materials, Inc., "Applied Siconi™ Preclean," printed on Aug. 7, 2009, 8 pages.
Carlson, et al., "A Negative Spacer Lithography Process for Sub-100nm Contact Holes and Vias", University of California at Berkeley, Jun. 19, 2007, 4 pp.
Chang et al. "Frequency Effects and Properties of Plasma Deposited Fluorinated Silicon Nitride", J. Vac Sci Technol B 6(2), Mar./Apr. 1988, pp. 524-532.
Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.
Examination Report dated Jun. 28, 2010 for European Patent Application No. 05251143.3.
Fukada et al., "Preparation of SiOF Films with Low Dielectric Constant by ECR Plasma CVD," ISMIC, DUMIC Conference, Feb. 21-22, 1995, pp. 43-49.
Hashim et al., "Characterization of thin oxide removal by RTA Treatment," ICSE 1998 Proc. Nov. 1998, Rangi, Malaysia, pp. 213-216.
Hausmann, et al., "Rapid Vapor Deposition of Highly Conformal Silica Nanolaminates," Science, Oct. 11, 2002, p. 402-406, vol. 298.
Hayasaka, N. et al. "High Quality Low Dielectric Constant SiO2 CVD Using High Density Plasma," Proceedings of the Dry Process Symposium, 1993, pp. 163-168.
Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.
International Search Report and Written Opinion of the International Searching Authority mailed Jul. 3, 2008 (PCT/US05/46226).
International Search Report and Written Opinion for PCT Application No. PCT/US2011/027221, mailed on Nov. 1, 2011, 8 pages.
International Search Report and Written Opinion of PCT/US2010/057676 mailed on Jun. 27, 2011, 9 pages.
International Search Report and Written Opinion of PCT/US2011/030582 mailed Dec. 7, 2011, 9 pages.
International Search Report and Written Opinion of PCT/US2011/064724 mailed on Oct. 12, 2012, 8 pages.
International Search Report and Written Opinion of PCT/US2012/028952 mailed on Oct. 29, 2012, 9 pages.
International Search Report and Written Opinion of PCT/US2012/048842 mailed on Nov. 28, 2012, 10 pages.
International Search Report and Written Opinion of PCT/US2012/053329 mailed on Feb. 15, 2013, 8 pages.
International Search Report and Written Opinion of PCT/US2012/057294 mailed on Mar. 18, 2013, 12 pages.
International Search Report and Written Opinion of PCT/US2012/057358 mailed on Mar. 25, 2013, 10 pages.
International Search Report and Written Opinion of PCT/US2012/058818 mailed on Apr. 1, 2013, 9 pages.
International Search Report and Written Opinion of the International Searching Authority for PCT Application No. PCT/US2012/028957, mailed on Oct. 18, 2012, 9 pages.
International Search report and Written Opinion of PCT/CN2010/000932 dated Mar. 31, 2011, 8 pages.
Japanese Patent Office, Official Action for Application No. 2007-317207 mailed on Dec. 21, 2011, 2 pages.
International Search Report and Written Opinion of PCT/US2013/076217 mailed on Apr. 28, 2014, 11 pages.
Jung, et al., "Patterning with amorphous carbon spacer for expanding the resolution limit of current lithography tool", Proc. SPIE , 2007, 9 pages, vol. 6520, 65201C.
Laxman, "Low $\epsilon$ Dielectrics: CVD Fluorinated Silicon Dioxides", Semiconductor International, May 1995, pp. 71-74.
Lee, et al., "Dielectric Planarization Techniques for Narrow Pitch Multilevel Interconnects," IEEE, V-MIC Conference Jun. 15-16, 1987, pp. 85-92 (1987).
Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.
Meeks, Ellen et al., "Modeling of $SiO_2$ deposition in high density plasma reactors and comparisons of model predictions with experimental measurements," J. Vac. Sci. Technol. A, Mar./Apr. 1998, pp. 544-563, vol. 16(2).
Mukai, et al., "A Study of CD Budget in Spacer Patterning Process", Toshiba, SPIE 2008, Feb. 26, 2008, 12 pages.
Nishino, et al.; Damage-Free Selective Etching of SI Native Oxides Using NH3/NF3 and SF6/H20 Down-Flow Etching, The Japanese Society of Applied Physics, vol. 74, No. 2, pp. 1345-1348, XP-002491959, Jul. 15, 1993.
Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.
Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.
Qian, et al., "High Density Plasma Deposition and Deep Submicron Gap Fill with Low Dielectric Constant SiOF Films," ISMIC, DUMIC Conference Feb. 21-22, 1995, pp. 50-56.
Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.
Shapiro, et al. "Dual Frequency Plasma CVD Fluorosilicate Glass: Water Absorption and Stability", ISMIC, DUMIC Conference Feb. 21-22, 1995, pp. 118-123.
S.M. Sze, VLSI Technology, McGraw-Hill Book Company, pp. 107, 108.
C.C. Tang and D. W. Hess, Tungsten Etching in CF4 and SF6 Discharges, J. Electrochem. Soc., 1984, 131 (1984) p. 115-120.
Usami, et al., "Low Dielectric Constant Interlayer Using Fluorine-Doped Silicon Oxide", Jpn. J. Appl. Phys., Jan. 19, 1994. pages 408-412, vol. 33 Part 1, No. 1B.
Wang et al.; Ultra High-selectivity silicon nitride etch process using an inductively coupled plasma source; J. Vac. Sci. Techno!. A 16(3),May/Jun. 1998, pp. 1582-1587.
Wolf et al.; Silicon Processing for the VLSI Era; vol. 1; 1986; Lattice Press, pp. 546, 547, 618, 619.
Yang, R., "Advanced in situ pre-Ni silicide (Siconi) cleaning at 65 nm to resolve defects in NiSix modules," J. Vac. Sci., Technol. B, Microelectron. Nanometer Struct., vol. 28, No. 1, Jan. 2010, 6 pgs.
Yasuda et al., "Dual-function remote plasma etching/cleaning system applied to selective etching of Si02 and removal of polymeric residues," J. Vac. Sci. Technol., A, vol. 11, No. 5, 1993, 12 pgs.
Yu, et al., "Step Coverage Study of Peteos Deposition for Intermetal Dielectric Applications," abstract, VMIC conference, Jun. 12-13, 1990, 7 pages, No. 82.
Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.
Derwent 2006-065772, Formation of multilayer enscapulating film over substrate, e.g. displace device, comprising delivering mixture precursors and hydrogen gas into substrate processing system, 2006.

\* cited by examiner

OXIDE AND METAL REMOVAL

FIELD

Embodiments of the invention relate to gas-phase etching metal.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Remote plasma etch processes have recently been developed to selectively remove several dielectrics relative to one another. However, dry-etch processes are still needed, which delicately remove metals which have limited or no previously known chemically volatile pathways.

SUMMARY

Methods are described herein for etching metal films which are difficult to volatize. The methods include exposing a metal film to a chlorine-containing precursor (e.g. $Cl_2$). Chlorine is then removed from the substrate processing region. A carbon-and-nitrogen-containing precursor (e.g. TMEDA) is delivered to the substrate processing region to form volatile metal complexes which desorb from the surface of the metal film. The methods presented remove metal while very slowly removing the other exposed materials. A thin metal oxide layer may be present on the surface of the metal layer, in which case a local plasma from hydrogen may be used to remove the oxygen or amorphize the near surface region, which has been found to increase the overall etch rate.

Embodiments of the invention include methods of etching metal from a substrate. The methods include flowing a hydrogen-containing precursor into a first substrate processing region housing the substrate while forming a plasma in the plasma substrate processing region to treat a thin metal oxide layer formed on a metal layer. The methods further include flowing a halogen-containing precursor into a second substrate processing region. The second substrate processing region is plasma-free during the flowing of the halogen-containing precursor. The methods further include flowing a carbon-and-nitrogen-containing precursor into the second substrate processing region. The second substrate processing region is plasma-free during the flowing of the carbon-and-nitrogen-containing precursor. Flowing of the carbon-and-nitrogen-containing precursor occurs after flowing the halogen-containing precursor.

Embodiments of the invention include methods of etching metal from a substrate. The methods include transferring the substrate into the substrate processing region. The methods further include flowing a hydrogen-containing precursor into a substrate processing region while forming a plasma to treat a thin metal oxide layer formed on a metal layer. The methods further include flowing a halogen-containing precursor into the substrate processing region. The substrate processing region is plasma-free during the flowing of the halogen-containing precursor. Flowing the halogen-containing precursor occurs after flowing the hydrogen-containing precursor. The methods further include purging the substrate processing region with a relatively inert gas to remove the halogen-containing precursor from the substrate processing region. The methods further include flowing a carbon-and-nitrogen-containing precursor in to the substrate processing region. The substrate processing region is plasma-free during the flowing of the carbon-and-nitrogen-containing precursor and flowing of the carbon-and-nitrogen-containing precursor occurs after purging the substrate processing region. The methods further include removing the substrate from the substrate processing region.

Additional embodiments and features are set forth in part in the description that follows, and in part will become apparent to those skilled in the art upon examination of the specification or may be learned by the practice of the embodiments. The features and advantages of the embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods are described herein for etching metal films which are difficult to volatize. The methods include exposing a metal film to a chlorine-containing precursor (e.g. $Cl_2$). Chlorine is then removed from the substrate processing region. A carbon-and-nitrogen-containing precursor (e.g. TMEDA) is delivered to the substrate processing region to form volatile metal complexes which desorb from the surface of the metal film. The methods presented remove metal from the substrate while very slowly removing the other exposed materials. A thin metal oxide layer may be present on the surface of the metal layer, in which case a local plasma from hydrogen may be used to remove the oxygen or amorphize the near surface region, which has been found to increase the overall etch rate.

Figure 1:
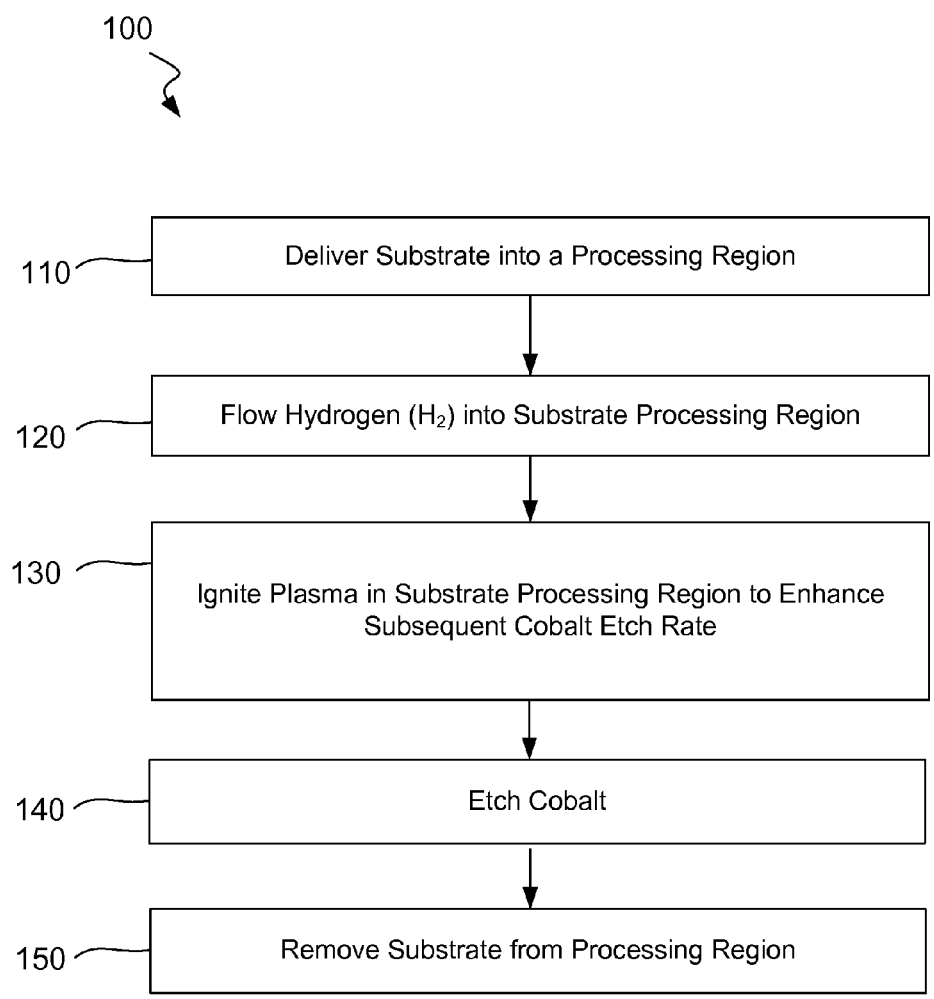
FIG. 1 is a flow chart of a cobalt etch process according to embodiments.

In order to better understand and appreciate the invention, reference is now made to FIG. 1 which is a flow chart of a cobalt etch process 100 according to embodiments. The cobalt film of this example has a thin native oxide layer on its surface due to atmospheric exposure. Cobalt may be in the form of a blanket layer on a substrate or cobalt may reside in discrete regions of a patterned substrate surface. In either case, the cobalt forms exposed surfaces of the surface of the substrate once the cobalt oxide layer is modified/removed. The substrate is delivered into a substrate processing region (operation 110).

A flow of hydrogen ($H_2$) is introduced into the substrate processing region (operation 120). Other sources of hydrogen may be used to augment or replace the molecular hydrogen. In general, a hydrogen-containing precursor may be flowed into the substrate processing region and the hydrogen-containing precursor may be oxygen-free and/or carbon-free according to embodiments. A local plasma is formed, in operation 130, from the hydrogen-containing precursor in the substrate processing region to process the cobalt oxide layer. The local plasma treatment results in a faster subsequent cobalt etch rate in cobalt etch process 100, either by removing oxygen and exposing cobalt or otherwise transforming the cobalt oxide layer to promote the cobalt etch rate in operation 140. The substrate is removed, following cobalt etching operation 140, in operation 150 of cobalt etch process 100.

Figure 2:
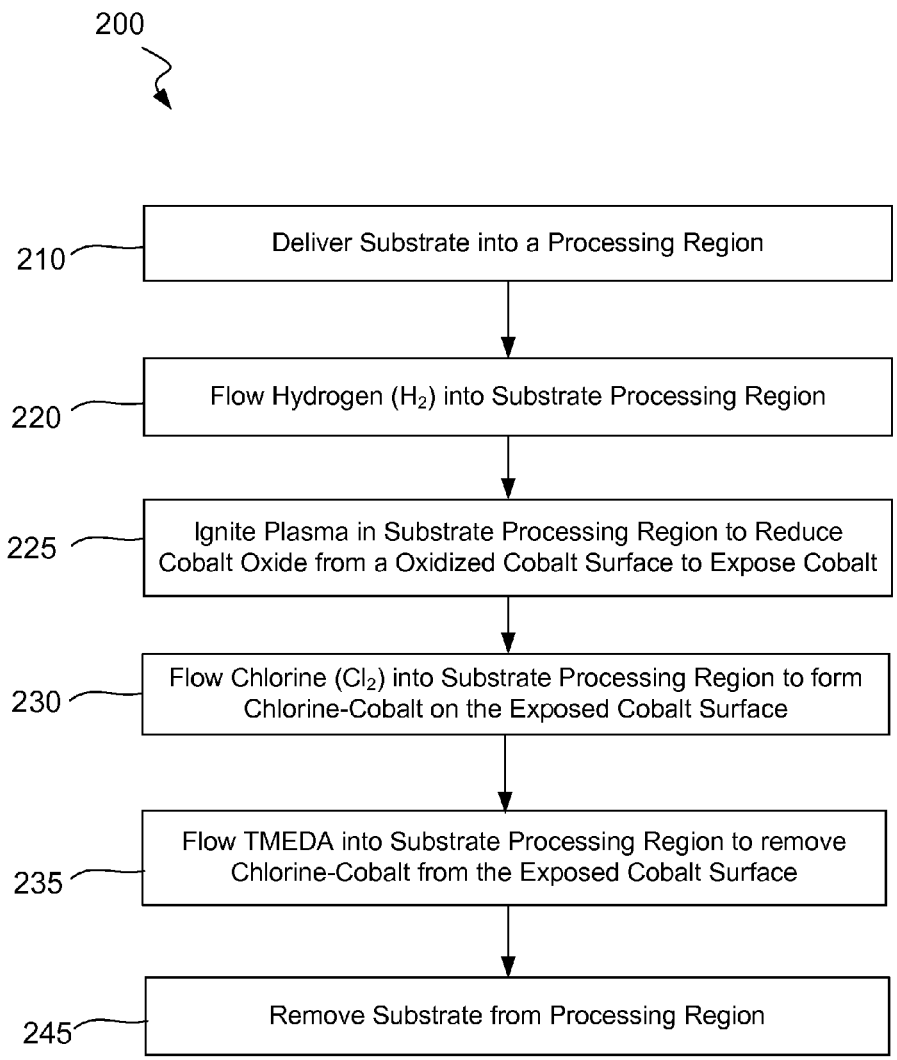
FIG. 2 is a flow chart of a cobalt etch process according to embodiments.

Reference is now made to FIG. 2 which is a flow chart of another cobalt etch process 200 according to embodiments. The cobalt film of this example has a cobalt oxide layer on top of cobalt. The substrate is delivered into a substrate processing region (operation 210). A flow of hydrogen ($H_2$) is introduced into the substrate processing region (operation 220). As before, a hydrogen-containing precursor may generally be flowed into the substrate processing region and the hydrogen-containing precursor may be oxygen-free and/or carbon-free according to embodiments. In operation 225, a local plasma is formed from the hydrogen-containing precursor in the substrate processing region to process the cobalt oxide layer. The local plasma treatment results in a faster subsequent cobalt etch rate, possibly by removing oxygen and exposing cobalt or otherwise transforming/modifying the cobalt oxide layer to promote the cobalt etch rate. Cobalt may be exposed in operation 225 or during subsequent operations depending on the removal mechanism.

A flow of chlorine ($Cl_2$) is introduced into a substrate processing region in operation 230. Other sources of chlorine may be used to augment or replace the chlorine. More generally, a chlorine-containing precursor may be flowed into the substrate processing region, such as chlorine ($Cl_2$), xenon dichloride or boron trichloride. A halogen-containing precursor may also be used instead or to augment the chlorine-containing precursor as described shortly. Exposing the cobalt to chlorine may occur with plasma or without any plasma in the substrate processing region in embodiments. In other words, the substrate processing region may be plasma-free during operation 230 of cobalt etch process 200. The cobalt (or thin modified cobalt oxide layer initially) reacts with the chlorine to presumably form cobalt-chloride adsorbates on or near the surface of the substrate. The cobalt-chloride adsorbates facilitate the subsequent removal of cobalt from the substrate.

A carbon-and-nitrogen-containing precursor is flowed into the substrate processing region in operation 235 of cobalt etch process 200. The carbon-and-nitrogen-containing precursor may possess at least one carbon-nitrogen bond and the bond may be a single bond in embodiments. The carbon-and-nitrogen-containing precursor comprises at least two nitrogen atoms according to embodiments. The carbon-and-nitrogen-containing precursor may consist of carbon, nitrogen and hydrogen in embodiments. The carbon-and-nitrogen-containing precursor comprises at least two, three or four methyl groups according to embodiments. An exemplary carbon-and-nitrogen-containing precursor is tetramethylethylenediamine (aka TMEDA or $C_6H_{16}N_2$). The carbon-and-nitrogen-containing precursor is flowed into the plasma region after the operation of flowing the chlorine-containing precursor in embodiments. Chlorine may be removed from the substrate processing region prior to operation 235 and the substrate processing region may be actively purged with a relatively inert gas between operations 230 and 235 to avoid having the carbon-and-nitrogen-containing precursor react with the halogen-containing precursor. The reaction between the carbon-and-nitrogen-containing precursor and the chlorine-containing precursor may produce undesirable deposition and accumulation on the substrate or processing system hardware in embodiments. The substrate is removed in operation 245 of cobalt etch process 200.

In general, a halogen-containing precursor may be used in place of the chlorine-containing precursor (e.g. $Cl_2$) of cobalt etch process 200. The halogen-containing precursor may include at least one of chlorine or bromine in embodiments. The halogen-containing precursor may be a diatomic halogen, a homonuclear diatomic halogen or a heteronuclear diatomic halogen according to embodiments.

A reaction between the carbon-and-nitrogen-containing precursor and the halogen-containing precursor has been found to not only reduce the efficacy of the etch process, but also produces solid residue which can clog chamber features and impede flow rates. To avoid forming solid residue, the substrate processing region may be purged between the operations of flowing the halogen-containing precursor (operation 230) and flowing the carbon-and-nitrogen-containing precursor (operation 235) into the substrate processing region. Flowing the carbon-and-nitrogen-containing precursor 235 occurs after flowing the halogen-containing precursor 230 which occurs after the operation of flowing the hydrogen 220 (and igniting the hydrogen plasma 225) in embodiments. The operations may be repeated (in an "etch cycle" as referred to herein) in several ways to remove additional cobalt when desired. The substrate processing region may be purged with a relatively inert gas following operation 235, at which point operation 230 may be repeated to rechlorinate the cobalt surface. Operation 235 may then be repeated again with another optional purging operation between operations 230 and 235. A relatively inert gas may be, for example, helium and/or argon.

A different etch cycle has been found to be beneficial as well alone or in combination with the etch cycle just described. The substrate processing region may be purged following operation 235 and cobalt etch process 200 may repeat operations 220-235 to remove additional cobalt. Operation 220/225, 230 and 235 occur as an ordered series according to embodiments. Repeating operations 220-235 has been found to produce a more uniform cobalt surface in some cases. Cobalt etch process 100 may use this type of etch cycle by repeating operations 120/130 and operation 140 an integral number of times before removing the substrate from the substrate processing region in operation 150.

The term "pretreatment" will be used to describe operations 220 and 225 in their general form. The term "etch cycle" will be used to describe operation 230 (involving the halogen-containing precursor) followed by operation 235 (involving the carbon-and-nitrogen-containing precursor). The pretreatment has been found to increase the cobalt etch rate. Each etch cycle may remove between about 2 Å and about 8 Å or between about 3 Å and about 6 Å according to embodiments. Performing a pretreatment followed by multiple etch cycles (e.g. 30 or 60) has been found to remove cobalt at these appreciable etch rates. However, an improvement in etch rate smoothness has been found if the pretreatment is periodically repeated. The pretreatment is repeated every 2 to 25 etch cycles or every 5 to 15 etch cycles in embodiments. Periodically repeating the pretreatment appears to clear the surface of any residual reactants and increase the uniformity and activity of reaction sites. The improvement in etch uniformity has been observed for blanket substrate and also for patterned substrates where cobalt has been deposited within gaps in the pattern. In such gapfill applications, cobalt may need to be "recessed" to below the top of the gap. The pretreatment may be repeated 2 to 5 times and each pretreatment may be followed by 2 to 25 or 5 to 15 etch cycles. In this way, cobalt etch process 200 has been found to produce an even recess of gapfill cobalt.

The carbon-and-nitrogen-containing precursor may be TMEDA ($C_6H_{16}N_2$) as in the example, but may be other precursors. In general, the carbon-and-hydrogen-containing precursor may include carbon and nitrogen and may consist only of carbon, nitrogen and hydrogen. The carbon-and-nitrogen-containing precursor may possess at least one carbon-nitrogen bond and the bond may be a single bond in embodiments. The carbon-and-nitrogen-containing precursor comprises at least two nitrogen atoms according to embodiments. The carbon-and-nitrogen-containing precursor may include a phenyl group in embodiments. For example, the carbon-and-nitrogen-containing precursor may include o-phenylenediamine, p-phenylenediamine and/or m-phenylenediamine according to embodiments. Chemically linear options are also possible, the carbon-and-nitrogen-containing precursor may be of the form $R_2$—N—$[CH_2]_m$—N—$R_2$, where m is 1, 2 or 3 and R is H, $CH_3$, $C_2H_5$ or a higher order hydrocarbon.

Creating volatile reaction products from cobalt removes material during cobalt etch process 100 or cobalt etch process 200. The volatile reaction products are thought to include methyl cobalt complexes such as $Co(CH_3)_4$. Exposing cobalt first to chlorine (operation 230) and then to the carbon-and-nitrogen-containing precursor (operation 235) has been found to produce the production worthy etch rate of cobalt and presumably makes volatile reaction products which leave the surface by desorption. Cobalt chloride complexes have been found to be nonvolatile with or without plasma treatment. However, the formation of cobalt chloride complexes have been found to be a conducive intermediate state toward volatization and desorption.

In embodiments, the chlorine-containing precursor (e.g. $Cl_2$) may be flowed into the substrate processing region at a flow rate of between about 3 sccm (standard cubic centimeters per minute) and about 50 sccm or between about 5 sccm and about 20 sccm in embodiments. The carbon-and-nitrogen-containing precursor may be flowed at a flow rate of between about 10 sccm and about 300 sccm or between about 20 sccm and about 200 sccm according to embodiments. The carbon-and-nitrogen-containing precursor may be a liquid prior to entering the substrate processing region, in which case a bubbler and carrier gas may be used to flow the precursor into the substrate processing region. The bubbler may heat the precursor above room temperature, for example to between about 25° C. and about 60° C., to increase the vapor pressure while the carrier gas is flowed through the liquid. The carrier gas may be relatively inert in comparison to the carbon-and-nitrogen-containing precursor. Helium may be used as the carrier gas. The carrier gas may be flowed at between about 1 slm (standard liters per minute) and about 5 slm according to embodiments. One of ordinary skill in the art would recognize that other gases and/or flows may be used depending on a number of factors including processing chamber configuration, substrate size, geometry and layout of features being etched.

The substrate processing region may be devoid of plasma or "plasma-free" during the cobalt etch operation 140, during the flow of the halogen-containing precursor (e.g. operation 230) and/or during the flow of the carbon-and-nitrogen-containing precursor (e.g. operation 235). The substrate processing region may be plasma-free during an etch cycle according to embodiments. In embodiments, a plasma-free substrate processing region means there is essentially no concentration of ionized species and free electrons within the substrate processing region.

In embodiments, the hydrogen-containing precursor (e.g. $H_2$) may be flowed into the substrate processing region at a flow rate of between about 50 sccm and about 2,000 sccm or between about 100 sccm and about 1,000 sccm in embodiments. The method also includes applying energy to the hydrogen-containing precursor in the substrate processing region during operations 130 and 225 to form a hydrogen plasma. The plasma in the substrate processing region may be generated using a variety of techniques (e.g., radio frequency excitations, capacitively-coupled power and/or inductively coupled power). In an embodiment, the energy is applied using a capacitively-coupled plasma unit. The plasma power applied to the hydrogen-containing precursor may be between about 25 watts and about 1500 watts, between about 100 watts and about 1200 watts or between about 150 watts and about 700 watts according to embodiments. A sputtering component of the plasma may be included to help remove cobalt oxide which covers the cobalt to be etched. The plasma in the substrate processing region may be referred to herein as a local plasma.

During the operations of processing the cobalt oxide (e.g. operations 120-130 and 220), the operations of flowing the halogen-containing precursor (e.g. operation 230), and/or the operation of flowing the carbon-and-nitrogen-containing precursor (e.g. operation 235), the substrate may be maintained may be between about −30° C. and about 400° C. in general. In embodiments, the temperature of the substrate during the operations described may be greater than or about −30° C., greater than or about −10° C., greater than or about 10° C., or greater than or about 25° C. The substrate temperatures may be less than or about 400° C., less than or about 350° C., less than or about 250° C. in embodiments. The pressure in the substrate processing region may be about or below 20 Torr during each of the operations (e.g. operations 120-130, 220, 230 and/or 235), and may be about or below 15 Torr, 5 Torr or 3 Torr. For example, the pressure may be between about 10 mTorr and about 10 Torr.

Generally speaking, the cobalt is a "metal" and may be one of cobalt or nickel. Both cobalt and nickel have been found to etch using the methods described herein. The metal layer may consist of or consist essentially of cobalt and may consist of or consist essentially of nickel according to embodiments. The metal layer may consist of or consist essentially of a single element according to embodiments.

Additional process parameters are disclosed in the course of describing an exemplary processing chamber and system.

Exemplary Processing System

Figure 3A:
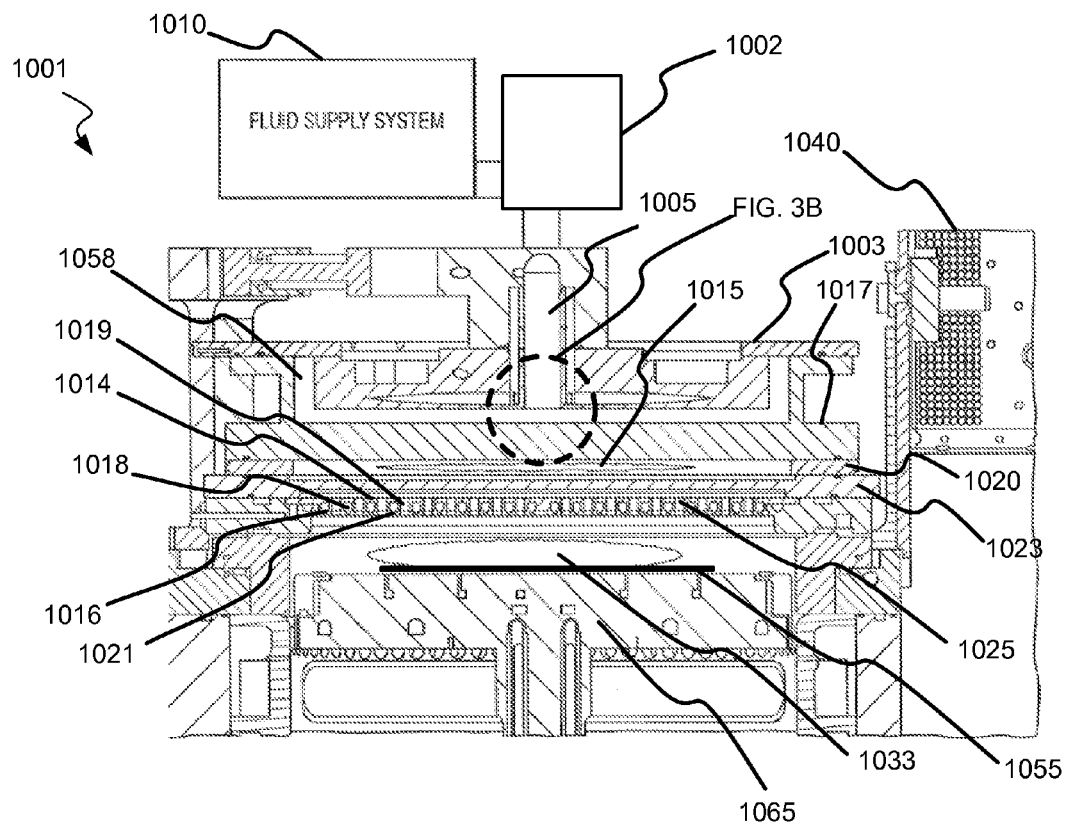
FIG. 3A shows a schematic cross-sectional view of a substrate processing chamber according to the disclosed technology.

FIG. 3A shows a cross-sectional view of an exemplary substrate processing chamber 1001 with partitioned plasma generation regions within the processing chamber. During film etching, a process gas may be flowed into chamber plasma region 1015 through a gas inlet assembly 1105. A remote plasma system (RPS) 1002 may optionally be included in the system, and may process a first gas which then travels through gas inlet assembly 1105. The inlet assembly 1105 may include two or more distinct gas supply channels where the second channel (not shown) may bypass the RPS 1002, if included. Accordingly, in embodiments the precursor gases may be delivered to the processing chamber in an unexcited state. In another example, the first channel provided through the RPS may be used for the process gas and the second channel bypassing the RPS may be used for a treatment gas in embodiments. The process gas may be excited within the RPS 1002 prior to entering the chamber plasma region 1015. Accordingly, the chlorine-containing precursor as discussed above, for example, may pass through RPS 1002 or bypass the RPS unit in embodiments. Various other examples encompassed by this arrangement will be similarly understood.

A cooling plate 1003, faceplate 1017, ion suppressor 1023, showerhead 1025, and a substrate support 1065 (also known as a pedestal), having a substrate 1055 disposed thereon, are shown and may each be included according to embodiments. The pedestal 1065 may have a heat exchange channel through which a heat exchange fluid flows to control the temperature of the substrate. This configuration may allow the substrate 1055 temperature to be cooled or heated to maintain relatively low temperatures, such as between about −20° C. to about 200° C., or there between. The heat exchange fluid may comprise ethylene glycol and/or water. The wafer support platter of the pedestal 1065, which may comprise aluminum, ceramic, or a combination thereof, may also be resistively heated to achieve relatively high temperatures, such as from up to or about 100° C. to above or about 1100° C., using an embedded resistive heater element. The heating element may be formed within the pedestal as one or more loops, and an outer portion of the heater element may run adjacent to a perimeter of the support platter, while an inner portion runs on the path of a concentric circle having a smaller radius. The wiring to the heater element may pass through the stem of the pedestal 1065, which may be further configured to rotate.

The faceplate 1017 may be pyramidal, conical, or of another similar structure with a narrow top portion expanding to a wide bottom portion. The faceplate 1017 may additionally be flat as shown and include a plurality of through-channels used to distribute process gases. Plasma generating gases and/or plasma excited species, depending on use of the RPS 1002, may pass through a plurality of holes, shown in FIG. 3B, in faceplate 1017 for a more uniform delivery into the chamber plasma region 1015.

Exemplary configurations may include having the gas inlet assembly 1105 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1105, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a unidirectional flow of plasma through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the first plasma region. A baffle (not shown) may additionally be located in the chamber plasma region 1015, or otherwise coupled with gas inlet assembly 1105, to affect the flow of fluid into the region through gas inlet assembly 1105.

The ion suppressor 1023 may comprise a plate or other geometry that defines a plurality of apertures throughout the structure that are configured to suppress the migration of ionically-charged species out of chamber plasma region 1015 while allowing uncharged neutral or radical species to pass through the ion suppressor 1023 into an activated gas delivery region between the suppressor and the showerhead. In embodiments, the ion suppressor 1023 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor.

The ion suppression element 1023 may function to reduce or eliminate the amount of ionically charged species traveling from the plasma generation region to the substrate. Showerhead 1025 in combination with ion suppressor 1023 may allow a plasma present in chamber plasma region 1015 to avoid directly exciting gases in substrate processing region 1033, while still allowing excited species to travel from chamber plasma region 1015 into substrate processing region 1033. In this way, the chamber may be configured to prevent the plasma from contacting a substrate 1055 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if the exposed second material is oxide, this material may be further protected by maintaining the plasma remotely from the substrate.

The processing system may further include a power supply 1040 electrically coupled with the processing chamber to provide electric power to the faceplate 1017, ion suppressor 1023, showerhead 1025, and/or pedestal 1065 to generate a plasma in the chamber plasma region 1015 or processing region 1033. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to chamber plasma region 1015. This in turn may allow development of particular plasma characteristics such that precursors may be dissociated in specific ways to enhance the etching profiles produced by these precursors.

A plasma may be ignited in chamber plasma region 1015 above showerhead 1025 and/or substrate processing region 1033 below showerhead 1025. A plasma may be present in chamber plasma region 1015 to produce plasma-excited hydrogen-containing precursors from an inflow of a hydrogen-containing precursor. A local plasma has also been found to work for the pretreatment and the hydrogen-containing precursor may be flowed into in substrate processing region 1033 and a local plasma may be formed to effect the pretreatment. The etch cycle may be performed in the same substrate processing region and the substrate processing region may be plasma-free during each operation of the etch cycle (for example during flowing of the halogen-containing precursor and the subsequent flowing of the carbon-and-nitrogen-containing precursor). An AC voltage typically in the radio frequency (RF) range may be applied between the conductive top portion of the processing chamber, such as faceplate 1017, and showerhead 1025 and/or ion suppressor 1023 to ignite a plasma in chamber plasma region 1015 during processes. An RF power supply may generate a high RF frequency of 13.56 MHz but may also generate other frequencies alone or in combination with the 13.56 MHz frequency.

Plasma power can be of a variety of frequencies or a combination of multiple frequencies. In the exemplary processing system the plasma may be provided by RF power delivered to faceplate 1017 relative to ion suppressor 1023 and/or showerhead 1025. The RF frequency applied in the exemplary processing system may be low RF frequencies less than about 200 kHz, high RF frequencies between about 10 MHz and about 15 MHz, or microwave frequencies greater than or about 1 GHz in different embodiments. The plasma power may be capacitively-coupled (CCP) or inductively-coupled (ICP) into the remote plasma region.

Plasma power may also be simultaneously applied to both chamber plasma region 1015 and substrate processing region 1033 during etching processes described herein. The frequencies and powers above apply to both regions. Either region may be excited using either a capacitively-coupled plasma (CCP) or an inductively-coupled plasma (ICP).

Chamber plasma region 1015 (top plasma in figure) may be left at low or no power when a bottom plasma in the substrate processing region 1033 is turned on to, for example, cure a film or clean the interior surfaces bordering substrate processing region 1033. A plasma in substrate processing region 1033 may be ignited by applying an AC voltage between showerhead 1055 and the pedestal 1065 or bottom of the chamber. A cleaning gas may be introduced into substrate processing region 1033 while the plasma is present.

A fluid, such as a precursor, for example a chlorine-containing precursor, may be flowed into the processing region 1033 by embodiments of the showerhead described herein. Excited species derived from the process gas in chamber plasma region 1015 may travel through apertures in the ion suppressor 1023, and/or showerhead 1025 and react with an additional precursor flowing into the processing region 1033 from a separate portion of the showerhead. Alternatively, if all precursor species are being excited in chamber plasma region 1015, no additional precursors may be flowed through the separate portion of the showerhead. Little or no plasma may be present in the processing region 1033. Excited derivatives of the precursors may combine in the region above the substrate and, on occasion, on the substrate to etch structures or remove species on the substrate in disclosed applications.

Exciting the fluids in the chamber plasma region 1015 directly, or exciting the fluids in the RPS units 1002, may provide several benefits. The concentration of the excited species derived from the fluids may be increased within the processing region 1033 due to the plasma in the chamber plasma region 1015. This increase may result from the location of the plasma in the chamber plasma region 1015. The processing region 1033 may be located closer to the chamber plasma region 1015 than the remote plasma system (RPS) 1002, leaving less time for the excited species to leave excited states through collisions with other gas molecules, walls of the chamber, and surfaces of the showerhead.

The uniformity of the concentration of the excited species derived from the process gas may also be increased within the processing region 1033. This may result from the shape of the chamber plasma region 1015, which may be more similar to the shape of the processing region 1033. Excited species created in the RPS 1002 may travel greater distances to pass through apertures near the edges of the showerhead 1025 relative to species that pass through apertures near the center of the showerhead 1025. The greater distance may result in a reduced excitation of the excited species and, for example, may result in a slower growth rate near the edge of a substrate. Exciting the fluids in the chamber plasma region 1015 may mitigate this variation for the fluid flowed through RPS 1002, or alternatively bypassed around the RPS unit.

The processing gases may be excited in chamber plasma region 1015 and may be passed through the showerhead 1025 to the processing region 1033 in the excited state. While a plasma may be generated in the processing region 1033, a plasma may alternatively not be generated in the processing region. In one example, the only excitation of the processing gas or precursors may be from exciting the processing gases in chamber plasma region 1015 to react with one another in the processing region 1033. As previously discussed, this may be to protect the structures patterned on the substrate 1055.

In addition to the fluid precursors, there may be other gases introduced at varied times for varied purposes, including carrier gases to aid delivery. A treatment gas may be introduced to remove unwanted species from the chamber walls and/or the substrate. A treatment gas may be excited in a plasma and then used to reduce or remove residual content inside the chamber. In other embodiments the treatment gas may be used without a plasma. When the treatment gas includes water vapor, the delivery may be achieved using a mass flow meter (MFM), an injection valve, or by commercially available water vapor generators. The treatment gas may be introduced to the processing region 1033, either through the RPS unit or bypassing the RPS unit, and may further be excited in the first plasma region.

Figure 3B:
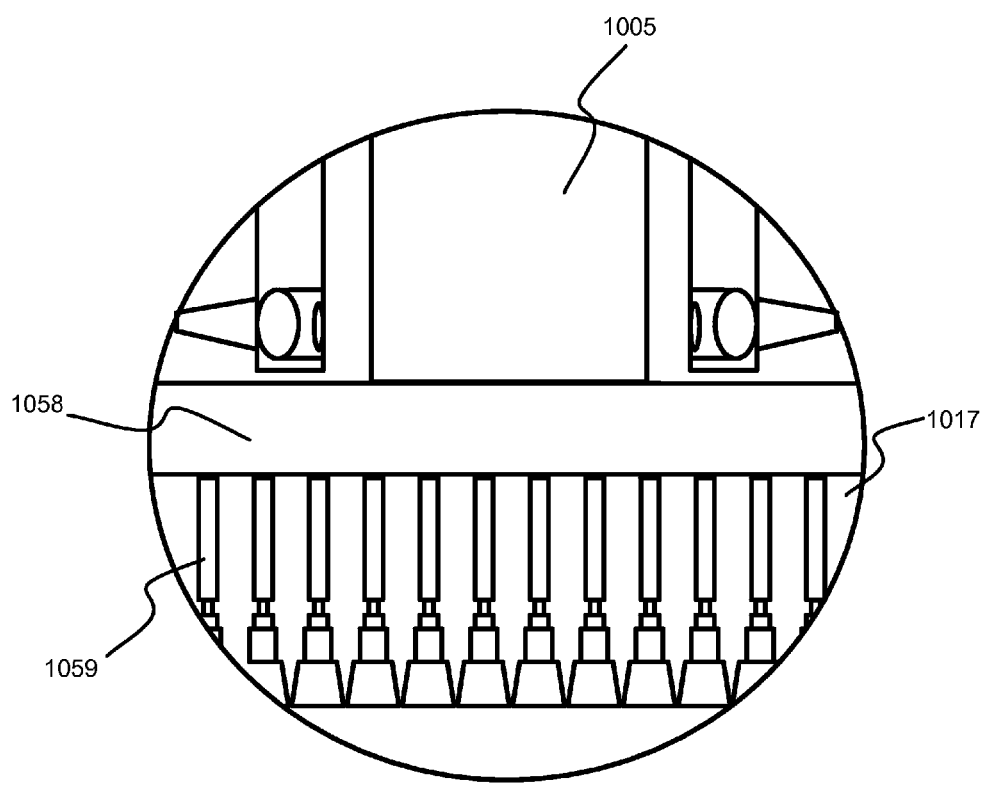
FIG. 3B shows a schematic cross-sectional view of a portion of a substrate processing chamber according to the disclosed technology.

FIG. 3B shows a detailed view of the features affecting the processing gas distribution through faceplate 1017. As shown in FIG. 3A and FIG. 3B, faceplate 1017, cooling plate 1003, and gas inlet assembly 1105 intersect to define a gas supply region 1058 into which process gases may be delivered from gas inlet 1105. The gases may fill the gas supply region 1058 and flow to chamber plasma region 1015 through apertures 1059 in faceplate 1017. The apertures 1059 may be configured to direct flow in a substantially unidirectional manner such that process gases may flow into processing region 1033, but may be partially or fully prevented from backflow into the gas supply region 1058 after traversing the faceplate 1017.

Figure 3C:
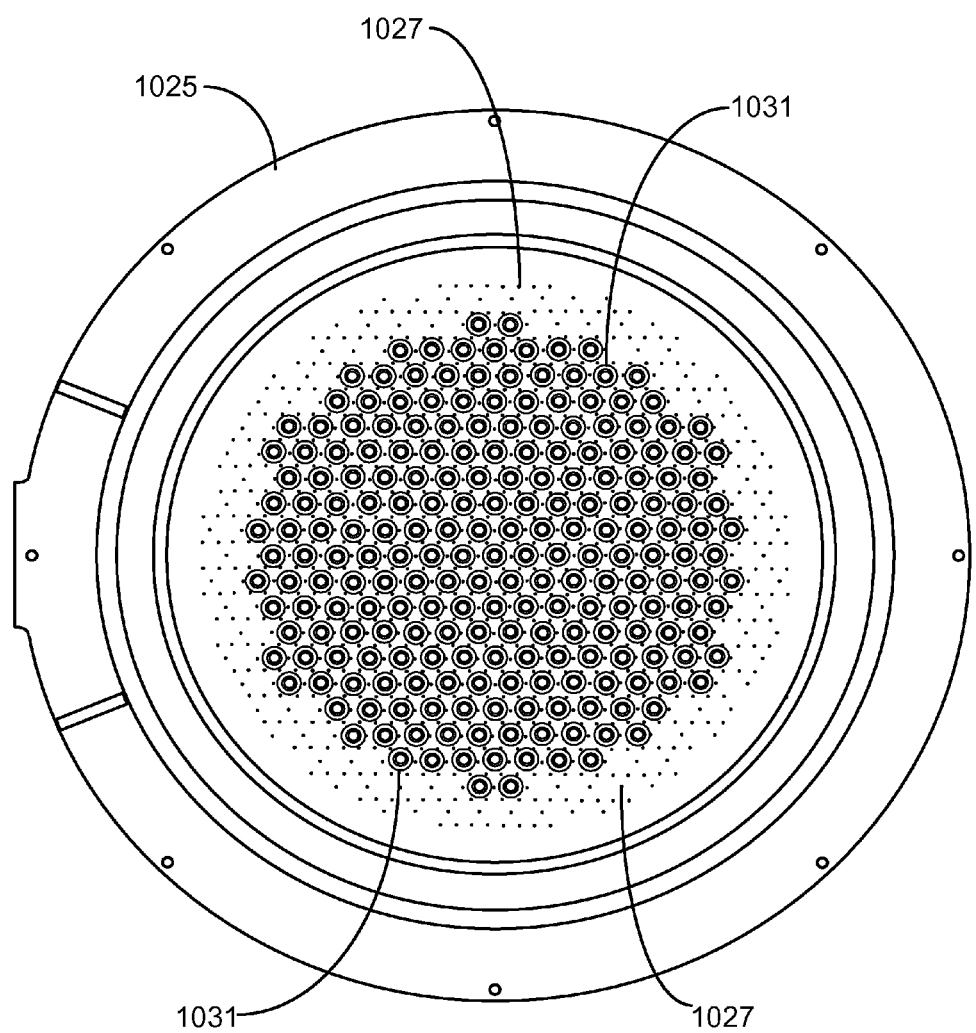
FIG. 3C shows a bottom plan view of a showerhead according to the disclosed technology.

The gas distribution assemblies such as showerhead 1025 for use in the processing chamber section 1001 may be referred to as dual channel showerheads (DCSH) and are additionally detailed in the embodiments described in FIG. 3A as well as FIG. 3C herein. The dual channel showerhead may provide for etching processes that allow for separation of etchants outside of the processing region 1033 to provide limited interaction with chamber components and each other prior to being delivered into the processing region.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary chamber of FIG. 3A includes a dual-channel showerhead, it is understood that alternative distribution assemblies may be utilized that maintain first and second precursors fluidly isolated prior to the processing region 1033. For example, a perforated plate and tubes underneath the plate may be utilized, although other configurations may operate with reduced efficiency or not provide as uniform processing as the dual-channel showerhead as described.

In the embodiment shown, showerhead 1025 may distribute via first fluid channels 1019 process gases which contain plasma effluents upon excitation by a plasma in chamber plasma region 1015. In embodiments, the process gas introduced into the RPS 1002 and/or chamber plasma region 1015 may contain hydrogen. The process gas may also include a carrier gas such as helium, argon, nitrogen ($N_2$), etc. Plasma effluents may include ionized or neutral derivatives of the process gas and may also be referred to herein as a radical-hydrogen precursor referring to the atomic constituent of the process gas introduced.

FIG. 3C is a bottom view of a showerhead 1025 for use with a processing chamber according to embodiments. Showerhead 1025 corresponds with the showerhead shown in FIG. 3A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

Substrate processing region 1033 can be maintained at a variety of pressures during the flow of precursors, any carrier gases, and plasma effluents into substrate processing region 1033. The pressure may be maintained between about 0.1 mTorr and about 20 Torr or between about 10 mTorr and about 10 Torr in different embodiments.

Figure 4:
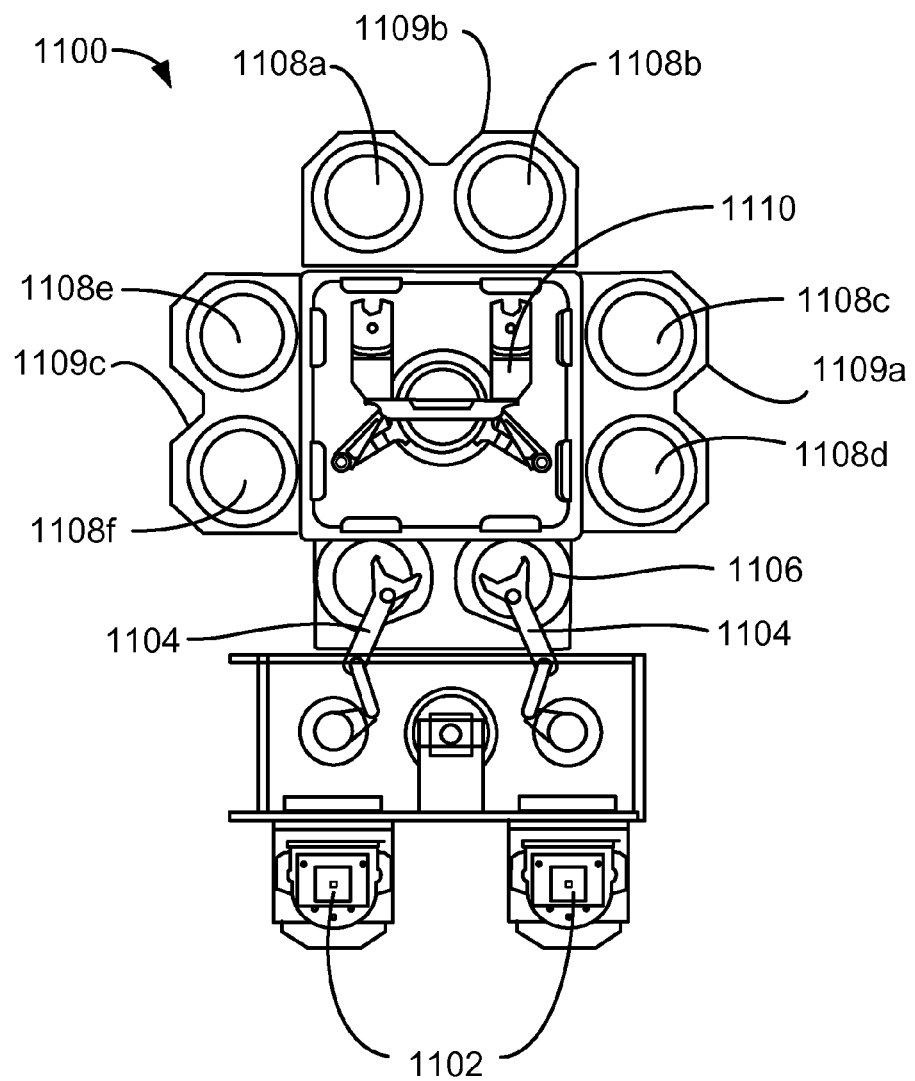
FIG. 4 shows a top plan view of an exemplary substrate processing system according to the disclosed technology.

Embodiments of the processing chambers may be incorporated into larger fabrication systems for producing integrated circuit chips. FIG. 4 shows one such processing system 1101 of deposition, etching, baking, and curing chambers according to embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 1108a-f may include one or more system components for depositing, annealing, curing and/or etching a dielectric film on the substrate wafer. In one configuration, two pairs of the processing chamber, e.g., 1108c-d and 1108e-f, may be used to deposit dielectric material on the substrate, and the third pair of processing chambers, e.g., 1108a-b, may be used to etch the deposited dielectric. In another configuration, all three pairs of chambers, e.g., 1108a-f, may be configured to etch a dielectric film on the substrate. Any one or more of the processes described may be carried out in chamber(s) separated from the fabrication system shown in different embodiments.

In the preceding description, for the purposes of explanation, numerous details have been set forth to provide an understanding of various embodiments of the present invention. It will be apparent to one skilled in the art, however, that certain embodiments may be practiced without some of these details, or with additional details.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" of the patterned substrate is predominantly Si but may include minority concentrations of other elemental constituents such as nitrogen, oxygen, hydrogen or carbon. Exposed "cobalt" of the patterned substrate is predominantly cobalt but may include minority concentrations of other elemental constituents such as oxygen, hydrogen and carbon. Of course, "exposed cobalt" may consist of only cobalt. Exposed "silicon nitride" of the patterned substrate is predominantly $Si_3N_4$ but may include minority concentrations of other elemental constituents such as oxygen, hydrogen and carbon. "Exposed silicon nitride" may consist of silicon and nitrogen. Exposed "silicon oxide" of the patterned substrate is predominantly $SiO_2$ but may include minority concentrations of other elemental constituents such as nitrogen, hydrogen and carbon. In some embodiments, silicon oxide films etched using the methods disclosed herein consist of silicon and oxygen. "Cobalt oxide" is predominantly cobalt and oxygen but may include minority concentrations of other elemental constituents such as nitrogen, hydrogen and carbon. Cobalt oxide may consist of cobalt and oxygen.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-chlorine" are radical precursors which contain chlorine but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the embodiments. Additionally, a number of well-known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching metal from a substrate, the method comprising:
   flowing a hydrogen-containing precursor into a first substrate processing region housing the substrate while forming a plasma in the first substrate processing region to treat a thin metal oxide layer formed on a metal layer;
   flowing a halogen-containing precursor into a second substrate processing region, wherein the second substrate processing region is plasma-free during the flowing of the halogen-containing precursor;
   flowing a carbon-and-nitrogen-containing precursor into the second substrate processing region, wherein the second substrate processing region is plasma-free during the flowing of the carbon-and-nitrogen-containing precursor and flowing of the carbon-and-nitrogen-containing precursor occurs after flowing the halogen-containing precursor; and
   removing at least a portion of the metal layer from the substrate.

2. The method of claim 1 wherein the metal comprises at least one of cobalt and nickel.

3. The method of claim 1 wherein the metal consists of a single element.

4. The method of claim 1 wherein the hydrogen-containing precursor comprises $H_2$.

5. The method of claim 1 wherein the carbon-and-nitrogen-containing precursor comprises tetramethylethylenediamine.

6. The method of claim 1 wherein the carbon-and-nitrogen-containing precursor comprises a carbon-nitrogen single bond.

7. The method of claim 1 wherein the carbon-and-nitrogen-containing precursor comprises at least two methyl groups.

8. The method of claim 1 wherein the halogen-containing precursor comprises at least one of chlorine or bromine.

9. The method of claim 1 wherein the halogen-containing precursor is a homonuclear diatomic halogen.

10. The method of claim 1 wherein the first substrate processing region and the second substrate processing region are the same substrate processing region.

11. The method of claim 1 wherein the carbon-and-nitrogen-containing precursor consists of carbon, nitrogen and hydrogen.

12. The method of claim 1 wherein a pressure within the substrate processing region is between about 0.01 Torr and about 10 Torr during one or more of flowing the hydrogen-containing precursor, flowing the halogen-containing precursor or flowing the carbon-and-nitrogen-containing precursor.

13. The method of claim 1 wherein forming the plasma to treat the thin metal oxide layer comprises applying a remote RF power between about 25 watts and about 1500 watts to the substrate processing region.

14. The method of claim 1 wherein forming the plasma to treat the thin metal oxide layer comprises applying a local capacitive plasma RF power a showerhead and the substrate.

15. The method of claim 1 wherein a processing temperature of the substrate is greater than or about −30° C. and less than or about 400° C. during the etching operation.

16. The method of claim 1, further comprising purging the second substrate processing region with an inert gas prior to flowing the carbon-and-nitrogen-containing precursor into the second substrate processing region to remove residual halogen-containing precursor from the second substrate processing region.

17. A method of etching metal from a substrate, the method comprising:
- transferring the substrate into a substrate processing region;
- flowing a hydrogen-containing precursor into the substrate processing region while forming a plasma to treat a thin metal oxide layer formed on a metal layer;
- flowing a halogen-containing precursor into the substrate processing region, wherein the substrate processing region is plasma-free during the flowing of the halogen-containing precursor and wherein flowing the halogen-containing precursor occurs after flowing the hydrogen-containing precursor;
- purging the substrate processing region with a relatively inert gas to remove the halogen-containing precursor from the substrate processing region;
- flowing a carbon-and-nitrogen-containing precursor in to the substrate processing region, wherein the substrate processing region is plasma-free during the flowing of the carbon-and-nitrogen-containing precursor and flowing of the carbon-and-nitrogen-containing precursor occurs after purging the substrate processing region;
- removing at least a portion of the metal layer from the substrate; and
- removing the substrate from the substrate processing region.

18. The method of claim 17 further comprising purging the substrate processing region with a relatively inert gas to remove the carbon-and-nitrogen-containing precursor from the substrate processing region and then repeating the operations of flowing the hydrogen-containing precursor, flowing the halogen-containing precursor, purging to remove the halogen-containing precursor and flowing the carbon-and-nitrogen-containing precursor.

* * * * *